(12) United States Patent
Wang et al.

(10) Patent No.: US 9,793,506 B2
(45) Date of Patent: Oct. 17, 2017

(54) DISPLAY PANEL WITH ANNULAR PROTRUSION AND ANNULAR GROOVE, PACKAGING METHOD THEREOF AND DISPLAY DEVICE

(71) Applicant: BOE TECHNOLOGY GROUP CO., LTD., Beijing (CN)

(72) Inventors: Wei Wang, Beijing (CN); Zhongyuan Sun, Beijing (CN); Kaihong Ma, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 48 days.

(21) Appl. No.: 14/439,465

(22) PCT Filed: Sep. 2, 2014

(86) PCT No.: PCT/CN2014/085734
§ 371 (c)(1),
(2) Date: Apr. 29, 2015

(87) PCT Pub. No.: WO2015/143843
PCT Pub. Date: Oct. 1, 2015

(65) Prior Publication Data
US 2016/0254482 A1 Sep. 1, 2016

(30) Foreign Application Priority Data

Mar. 27, 2014 (CN) .......................... 2014 1 0118169

(51) Int. Cl.
*H01L 51/52* (2006.01)
*H01L 51/56* (2006.01)
(Continued)

(52) U.S. Cl.
CPC ........ *H01L 51/5246* (2013.01); *H01L 51/524* (2013.01); *H01L 51/56* (2013.01)

(58) Field of Classification Search
CPC . H01L 51/5246; H01L 51/56; H01L 25/0753; H01L 33/62; H01L 27/153; H01L 33/20; F21K 9/00
(Continued)

(56) References Cited

U.S. PATENT DOCUMENTS

2005/0269926 A1* 12/2005 Fukuoka ............. H01L 51/5246
313/123
2007/0173167 A1* 7/2007 Choi .................... H01L 51/5246
445/25
(Continued)

FOREIGN PATENT DOCUMENTS

CN 101866584 A 10/2010
CN 101866943 A 10/2010
(Continued)

OTHER PUBLICATIONS

Dec. 31, 2014—(WO) International Search Report—App PCT/CN2014/085734—Eng Tran.
(Continued)

*Primary Examiner* — Allen Parker
*Assistant Examiner* — Didarul Mazumder
(74) *Attorney, Agent, or Firm* — Banner & Witcoff, Ltd.

(57) ABSTRACT

A display panel comprising a first substrate and a second substrate cell-assembled with the first substrate, wherein the first substrate is provided with at least one annular protrusion made of frit with the same center point, and the second substrate is provided with an encapsulating zone to fit the annular protrusion, the encapsulating zone comprising at least one annular groove, the amount of which is less than or equal to that of the annular protrusion(s). Embodiments of the present disclosure further provide a packaging method and a display device. An OLED display panel can be ensured (Continued)

to have good internal sealing property by means of its package, and its service life is prolonged.

18 Claims, 3 Drawing Sheets

(51) Int. Cl.
 *H01L 25/07* (2006.01)
 *H01L 33/62* (2010.01)
 *H01L 27/15* (2006.01)
 *F21K 9/00* (2016.01)
 *H01L 33/20* (2010.01)
(58) Field of Classification Search
 USPC .......................................................... 257/88
 See application file for complete search history.

(56) References Cited

U.S. PATENT DOCUMENTS

2012/0168808 A1* 7/2012 Lin ..................... H01L 51/5246
 257/99
2013/0059118 A1* 3/2013 Yeh ................... H01L 29/78603
 428/141
2014/0138702 A1* 5/2014 Choi ................. H01L 21/02032
 257/76

FOREIGN PATENT DOCUMENTS

| CN | 201946636 U | 8/2011 |
| CN | 103075587 A | 5/2013 |
| CN | 203134869 U | 8/2013 |
| CN | 103943657 A | 7/2014 |
| CN | 203760519 U | 8/2014 |
| KR | 20050020247 A | 3/2005 |
| KR | 100649942 B1 | 11/2006 |

OTHER PUBLICATIONS

Feb. 16, 2016—(CN)—First Office Action Appn 201410118169.7 with English Tran.
Jun. 3, 2016—(CN)—Second Office Action Appn 201410118169.7 with English Tran.

* cited by examiner

DISPLAY PANEL WITH ANNULAR PROTRUSION AND ANNULAR GROOVE, PACKAGING METHOD THEREOF AND DISPLAY DEVICE

The application is a U.S. National Phase Entry of International Application No. PCT/CN2014/085734 filed on Sep. 2, 2014, designating the United States of America and claiming priority to Chinese Patent Application No. 201410118169.7 filed on Mar. 27, 2014. The present application claims priority to and the benefit of the above-identified applications and the above-identified applications are incorporated by reference herein in their entirety.

TECHNICAL FIELD

Embodiments of the present disclosure relate to a display panel, a packaging method thereof, and to a display device.

BACKGROUND

Organic Light-Emitting Diode (OLED) display panels have become a promising next generation of display technology for their advantages such as thinness, lightness, wide viewing angle, active luminescence, continuously tunable luminous colors, low cost, fast response, low energy consumption, low driving voltages, wide range of operating temperatures, simple fabricating process, high luminous efficiency, flexible display and etc.

An OLED has a metal anode, a metal cathode and a light emitting layer with the metal anode and metal cathode cooperating to drive the light emitting layer to emit light. The inventor has founded that most organic substances in the light emitting layer of an OLED are greatly susceptible to contaminants, oxygen and water vapor in the atmosphere and meanwhile the metal cathode can be electrochemically corroded by the water vapor in the atmosphere, which greatly decreases the service life of an OLED display panel. Therefore, the package of an OLED display panel must ensure that the display panel has good sealing property to prolong its service life.

SUMMARY

The technical problem to be solved by the present disclosure is to provide a display panel, a packaging method thereof and a display device, so that an OLED display panel can be ensured to have good sealing property by means of its package to prolong the service life of the OLED display panel.

To solve the technical problem described above, the present disclosure proposes the following technical resolution.

In the first aspect of the present disclosure, a display panel is provided, which comprises a first substrate and a second substrate cell-assembled with the first substrate, the first substrate provided with at least one annular protrusion, the second substrate provided with an encapsulating zone which comprises at least one annular groove to fit the annular protrusion, and the amount of the annular groove(s) being less than or equal to the amount of the annular protrusion(s).

The at least one annular protrusion is formed of frit,

The cross section of the annular protrusion is a trapezoid.

The trapezoid of the annular protrusion has a height of 180 µm to 380 µm and a longer base with a length of 480 µm to 980 µm.

The cross section of the annular groove is a trapezoid.

The trapezoid of the annular groove has a height of 200 µm to 400 µm and a longer base with a length of 500 µm to 1000 µm.

The bottom surface of the annular groove is a rough surface.

In the technical resolutions according to embodiments of the present disclosure, a display panel is provided, which comprises a first substrate provided with an annular protrusion to fit with an annular groove provided in a second substrate upon cell-assembling. With respect to those substrates without the annular protrusion and the annular groove, the first and second substrates can effectively enhance the sealing property after being cell-assembled, and postpone access of air and water into the OLED light emitting layer between them, thus the service life of the OLED display panel is prolonged.

In the second aspect of the present disclosure, a display device comprising the display panel described above is provided.

In the third aspect of the present disclosure, a method for packaging the display panel described above is provided, the method comprising:

forming at least one annular protrusion with the same center point on a first substrate;

forming an encapsulating zone on a second substrate to fit with the at least one annular protrusion, the encapsulating zone comprising at least one annular groove, the amount of which is less than or equal to that of the annular protrusion(s);

coating curing glue in the annular groove, and aligning and pressing the first and second substrates to bond them together with the annular protrusion being located in the annular groove; and curing the curing glue in the annular groove.

The at least one annular protrusion is formed of frit,

A cross section of the annular protrusion is a trapezoid.

The trapezoid of the annular protrusion has a height of 180 µm to 380 µm and a longer base with a length of 480 µm to 980 µm.

A cross section of the annular groove is a trapezoid.

The trapezoid of the annular groove has a height of 200 µm to 400 µm and a longer base with a length of 500 µm to 1000 µm.

The bottom surface of the annular groove is a rough surface.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Embodiment 1

Figure 1:
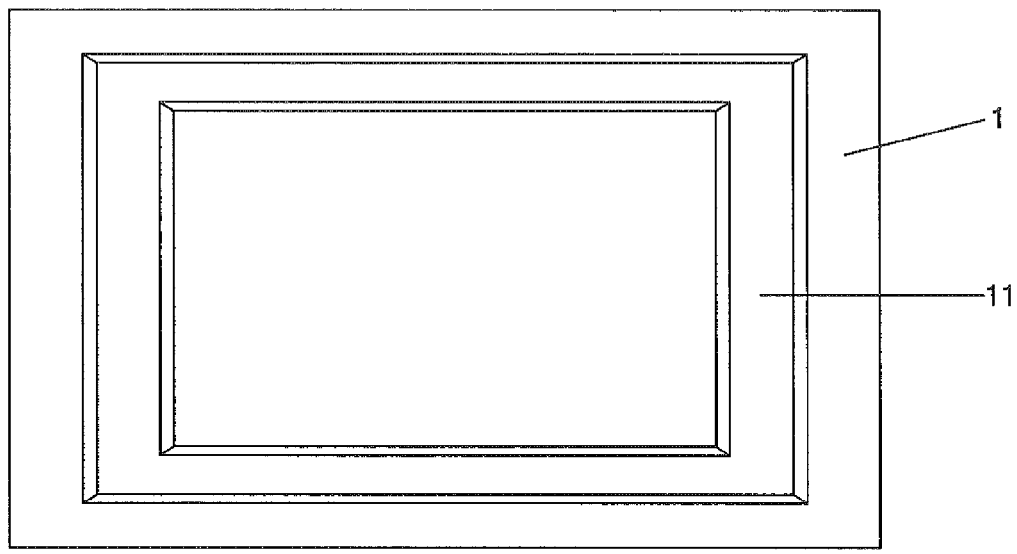
FIG. 1 is a schematic plan view of a first substrate according to an embodiment of the present disclosure.
Figure 2:
FIG. 2 is a schematic structural view of the first substrate according to an embodiment of the present disclosure.
Figure 3:
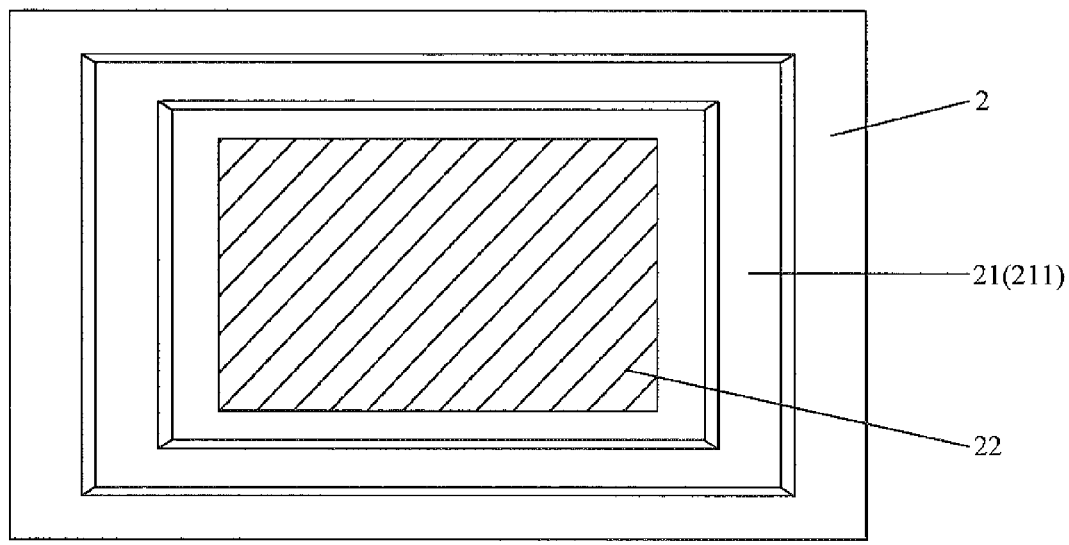
FIG. 3 is a schematic plan view of a second substrate according to an embodiment of the present disclosure.
Figure 4:
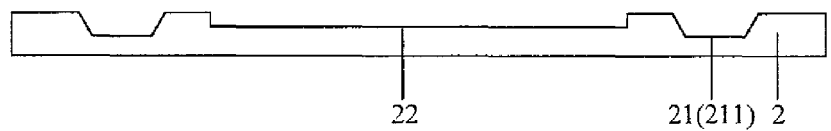
FIG. 4 is a schematic structural view of the second substrate according to an embodiment of the present disclosure.
Figure 5:
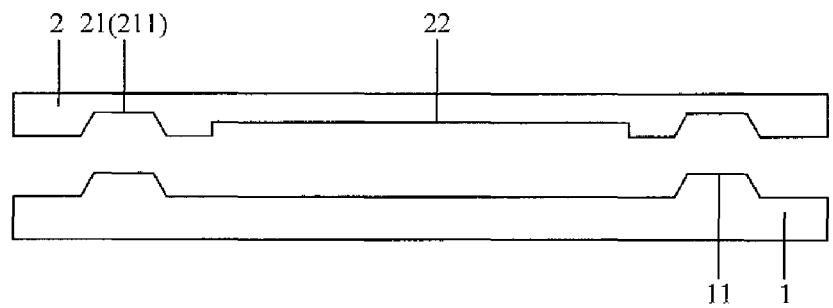
FIG. 5 is a first schematic view illustrating assembling the first and second substrates according to an embodiment of the present disclosure.

One embodiment of the present disclosure provides a display panel, which, as illustrated in FIG. 5, comprises a first substrate 1 and a second substrate 2 cell-assembled with the first substrate 1 with the first substrate 1. As illustrated in FIG. 1, 2, or 5, the first substrate is provided with at least one annular protrusion 11 formed of frit. As illustrated in FIG. 3, 4 or 5, the second substrate 2 is provided with an encapsulating zone 21 that fits with the annular protrusion 11 and comprises at least one annular groove 211, the amount of which is less than or equal to that of the protrusion(s) 11.

The display panel according to the present embodiment comprises the first substrate with the annular protrusion, which fits in the annular groove in the second substrate when assembling. The first and second substrates, with respect to those without the annular protrusion and the annular groove, can effectively enhance sealing after being assembled, postpone access of air and water to the OLED light emitting layer between the first substrate and the second substrate, and thus the service life of the OLED display panel is prolonged.

And furthermore, generally, after being packaged, the annular protrusion 11 and encapsulating zone 21 can further be covered by the frame of the display panel to prevent them from being seen by the user and thus affecting the display of the display panel. Curing glue is usually used to package the first substrate 1 and the second substrate 2, i.e. curing glue is filled between the annular protrusion 11 and the encapsulating zone 21. Under the limitation of the same width of the frame, the greater the amount of the provided protrusion(s) 11 is, the larger the contact area between the annular protrusion(s) 11 and the curing glue is, the longer the route is, along which foreign substances such as air, water etc. intrude into the OLED light emitting layer, and thus the better the sealing property of the two substrates is and the longer the service life of the OLED display panel is. Accordingly, with respect to the same contact area, the greater the amount of the annular protrusion(s) 11 is, the smaller the footprint of the annular protrusion(s) 11 is, which allows for further narrowing the frame of the display panel. It should be noted that, the amount of the annular protrusion (s) 11 actually deployed should be determined according to practical considerations such as the required sealing property and the frame width, and embodiments of the present disclosure are not limited hereto.

Figure 6:
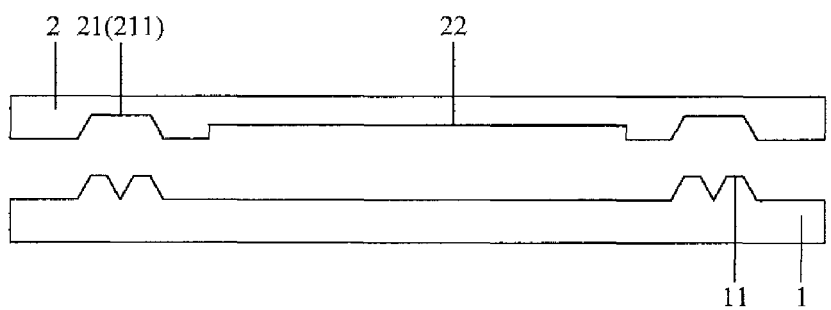
FIG. 6 is a second schematic view illustrating assembling the first and second substrates according to an embodiment of the present disclosure.
Figure 7:
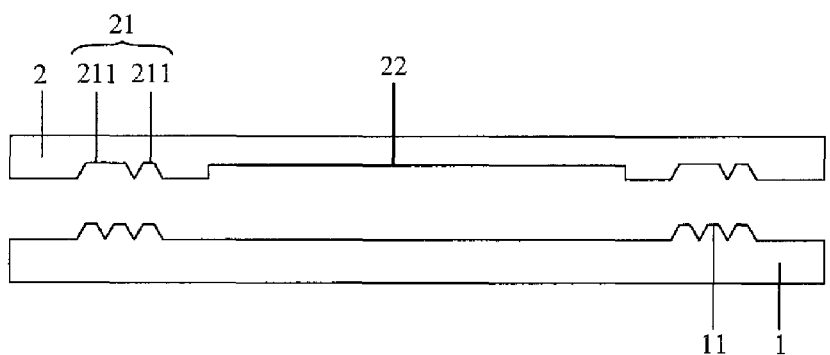
FIG. 7 is a third schematic view illustrating assembling the first and second substrates according to an embodiment of the present disclosure.

The annular groove 211 in the encapsulating zone is configured to fit the annular protrusion 11. As illustrated in FIG. 5, the annular groove(s) 211 is(are) the same as the annular protrusion(s) 11 in quantity, position and size, and here each annular groove 211 is disposed corresponding to one annular protrusion 11 to ensure the sealing property of the display panel as much as possible. However, in fact, by taking cost, production efficiency and manufacturing process into account, the amount of the annular groove(s) 211 can be decreased and the width of the annular groove can be increased, so that one annular groove 211 can accommodate two or more annular protrusions 11 after cell-assembling, as illustrated in FIGS. 6 and 7.

Figure 8:
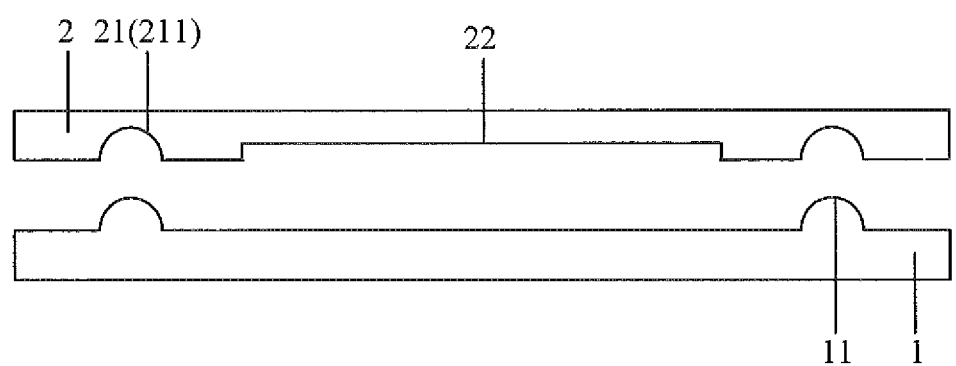
FIG. 8 is a fourth schematic view illustrating assembling the first and second substrates according to an embodiment of the present disclosure.

In the embodiment of the present disclosure, a shape of the cross-sectional of the annular protrusion 11 can be selected according to practical considerations. It can be any arbitrary shape, such as a semi-circle (as indicated in FIG. 8), a square or even an irregular shape. However, since the annular protrusion 11 is formed of frit, it will become an integral part of the first substrate 1 made of frit after being cured by baking, so that there is no path for intrusion of foreign substances such as air, water etc. between the annular protrusion 11 and the first substrate 1. Since the frit of the annular protrusion 11 still has some fluidity before being cured by baking, the cross section of the annular protrusion 11 can be chosen to be trapezoidal to simplify the manufacturing process and reduce the production cost.

Accordingly, the cross-sectional shape of the annular groove 211 can be an arbitrary shape such as a semi-circle (as indicated in FIG. 8), a square or even an irregular shape. In order to simplify the manufacturing process and reduce the production cost, the cross section of the annular groove 211 is selected to be trapezoidal.

In one embodiment of the present disclosure, only one annular protrusion 11 is disposed with its trapezoid having a longer bottom side of a length of 480 µm to 980 µm and a height of 180 µm to 380 µm. The trapezoid of the annular groove 211 here has a longer bottom side of a length of 500-1000 µm and a height of 200-400 µm, so as to cover the annular protrusion 11.

Additionally, in order to further improve the sealing property of the display panel and prolong the service life of the OLED display panel, the base surface of the annular groove 211 is selected to be a rough surface, such as a surface of ground glass.

It should be noted that, in the embodiment of the present disclosure, an array substrate can be used as the first substrate 1; since an array substrate has various structures disposed thereon such as thin film transistor units, OLED light emitting layers and etc., the second substrate 2 further comprises a groove 22, which can accommodate the various structures of the first substrate that protrude from the surface of the first structure, as illustrated in FIGS. 3, 4, 5, 6 and 7, so as to improve the sealing property of the first substrate 1 and the second substrate 2.

Obviously, the display panel according to the embodiments of the present disclosure is also applicable to a liquid crystal display panel, i.e. a liquid crystal layer is encapsulated between the first substrate 1 and the second substrate 2. Similarly, the display panel in the embodiment of the present disclosure can also be used to encapsulate electronic ink and then the display panel is electronic paper.

The present disclosure further provides a display device comprising the above-mentioned display panel. The display device can be any product or component with a display function, such as a liquid crystal panel, an electronic paper, an OLED panel, a liquid crystal TV set, a liquid crystal display, a digital picture frame, a cell phone, or a pad.

Embodiment 2

The embodiment of the present disclosure provides a method for packaging the display panel according to embodiment 1, the packaging method comprising the following steps.

Step 101, forming at least one annular protrusion on the first substrate through frit.

The annular protrusion is to be baked at a high temperature after being formed on the first substrate, so as to make it integrated with the first substrate after thorough solidification.

Step 102, forming at least one encapsulating zone on the second substrate to fit the at least one annular protrusion, the encapsulating zone comprising at least one annular groove, the amount of which is less than or equal to that of the annular protrusion.

Step 103, coating curing glue in the annular groove, and aligning and pressing the first and second substrates to bond them together with the annular protrusion being located in corresponding annular groove.

Step 104, curing the curing glue in the annular groove.

The curing glue in the annular groove is completely cured by UV irradiation.

It should be noted that, since the position and size of the annular protrusion are predetermined in streamlined production, step 102 can be performed before or simultaneously with step 101.

In one embodiment of the present disclosure, the cross section of the annular protrusion is a trapezoid, which has a longer bottom side with a length of 480 μm to 980 μm and a height of 180 μm to 380 μm; the cross section of the annular groove is a trapezoid, which has a longer bottom side of a length of 500μ to 1000 μm and a height of 200 μm to 400 μm.

In one embodiment of the present disclosure, the bottom surface of the annular groove is configured to be a rough surface.

The foregoing are merely exemplary embodiments of the disclosure, but are not used to limit the protection scope of the disclosure. The protection scope of the disclosure shall be defined by the attached claims.

The present application claims priority of China patent application No. 201410118169.7 filed on Mar. 27, 2014, which is incorporated herein entirely by reference as a part of the present application.

The invention claimed is:

1. A display panel, comprising:
   a first substrate; and
   a second substrate cell-assembled with the first substrate, wherein the first substrate is provided with a plurality of annular protrusions made of frit, the second substrate is provided with an encapsulating zone comprising at least one annular groove to fit the plurality of annular protrusions, and a number of the at least one annular groove is less than a number of the plurality of annular protrusions.

2. The display panel according to claim 1, wherein a cross section of the annular protrusions is a trapezoid.

3. The display panel according to claim 2, wherein the trapezoid of the annular protrusions has a longer bottom with a length of 480 μm to 980 μm and a height of 180 μm to 380 μm.

4. The display panel according to claim 1, wherein a cross section of the annular groove is a trapezoid.

5. The display panel according to claim 4, wherein the trapezoid of the annular groove has a longer bottom with a length of 500 μm to 1000 μm and a height of 200 μm to 400 μm.

6. The display panel according to claim 1, wherein a bottom surface of the annular groove is a rough surface.

7. A display device, comprising the display panel according to claim 1.

8. A method for packaging the display panel according to claim 1, the method comprising:
   forming the plurality of annular protrusions made of frit on the first substrate;
   forming the encapsulating zone on the second substrate;
   coating curing glue in the annular groove, aligning and pressing the first and second substrates positioned correspondingly to bond them together with the annular protrusions located in the corresponding annular groove; and
   curing the curing glue in the annular groove.

9. The packaging method according to claim 8, wherein a cross section of the annular protrusion is a trapezoid.

10. The packaging method according to claim 9, wherein the trapezoid of the annular protrusions has a longer bottom with a length of 480 μm to 980 μm and a height of 180 μm to 380 μm.

11. The packaging method according to claim 8, wherein a cross section of the annular groove is a trapezoid.

12. The packaging method according to claim 11, wherein the trapezoid of the annular groove has a longer bottom with a length of 500 μm to 1000 μm and a height of 200 μm to 400 μm.

13. The packaging method according to claim 8, wherein a bottom surface of the annular groove is a rough surface.

14. The display panel according to claim 2, wherein the cross section of the annular groove is a trapezoid.

15. The display panel according to claim 3, wherein the cross section of the annular groove is a trapezoid.

16. The display panel according to claim 1, wherein a bottom surface of the annular groove is a rough surface.

17. The display panel according to claim 3, wherein a bottom surface of the annular groove is a rough surface.

18. The display panel according to claim 4, wherein a bottom surface of the annular groove is a rough surface.

* * * * *